(12) United States Patent
Lee

(10) Patent No.: US 7,339,397 B2
(45) Date of Patent: Mar. 4, 2008

(54) DATA OUTPUT APPARATUS AND METHOD

(75) Inventor: Jong-Chern Lee, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 132 days.

(21) Appl. No.: 11/176,345

(22) Filed: Jul. 8, 2005

(65) Prior Publication Data

US 2006/0221717 A1    Oct. 5, 2006

(30) Foreign Application Priority Data

Mar. 31, 2005  (KR) ...................... 10-2005-0027404

(51) Int. Cl.
*H03K 19/003* (2006.01)
(52) U.S. Cl. .......................... 326/27; 326/30
(58) Field of Classification Search .................. 326/27, 326/26, 30
See application file for complete search history.

(56) References Cited

U.S. PATENT DOCUMENTS 7,088,150 B2 * 8/2006 Balhiser et al. ............. 327/108

FOREIGN PATENT DOCUMENTS

| JP | 55-163684 | 12/1980 |
|---|---|---|
| JP | 2000-076858 | 3/2000 |
| KR | 2001-0047533 | 6/2001 |
| KR | 10-2004-0078256 | 9/2004 |
| KR | 10-2005-0099844 | 10/2005 |

* cited by examiner

*Primary Examiner*—Rexford Barnie
*Assistant Examiner*—Thienvu V Tran
(74) *Attorney, Agent, or Firm*—McDermott Will & Emery LLP

(57) ABSTRACT

A data output apparatus and method in a global input and output (GIO) line transmits data via the GIO line. This data output apparatus includes a read driver driven responsive to an input of read data for inverting and amplifying the data to output inverted and amplified data onto the GIO line, a GIO termination unit driven responsive to a termination signal for rising or falling a voltage level on the GIO line by a preset level, prior to driving the data onto the GIO line by the read driver, and a receiver driven responsive to the read data transmitted through the GIO line for inverting and amplifying the read data to provide inverted and amplified data. This data output apparatus can enable a high rate data transmission by decreasing a swing width of data transmitted via the GIO line and also reduce a coupling noise on adjacent lines.

8 Claims, 6 Drawing Sheets

DATA OUTPUT APPARATUS AND METHOD

FIELD OF THE INVENTION

The present invention relates to an apparatus and method of transmitting data via a global input and output (GIO) line. More particularly, the present invention is directed to a data output apparatus and method capable of enabling a high rate data transmission on a GIO line by adjusting a size of driver, by an on operation of active load only under a specific condition after an install of the active load in the GIO line that is common line among banks.

DESCRIPTION OF RELATED ART

In general, data lines utilized in a semiconductor memory device are classified into segment input and output (SIO) line, local input and output (LIO) line, GIO line, etc., according to their usage purpose or location.

As the role of each input and output (IO) line in a read path, data on cell bit line is amplified and then carried on a SIO line by a column selection signal. And, the data on the SIO line is put on a LIO line sharing SIO lines of cell segment blocks. The data on the LIO makes a read driver 1 driven; and then it is inverted, amplified, and placed on a GIO line, as shown in FIG. 1. This GIO line is driven as a bank common line through each bank, and the data thereon is outputted via a desirable data pad from a receiver 2 for its reading operation.

FIG. 2 is a timing diagram representing the operation of the data output apparatus with the configuration of FIG. 1, which shows an appearance that logic high or logic low data to an input port IN of the read driver 1 is inverted into logic low or logic high data, and amplified and transferred onto the GIO line.

In the prior art structure, however, if the GIO line is lengthen due to an increase in chip area as a capacity of semiconductor device becomes large, the data on the GIO line is toggled by its full swing, as in FIG. 2. Consequently, there exists a problem that data delay is great and high rate operation is difficult, resulting in an issuance of serious coupling noise affecting adjacent other lines.

SUMMARY OF THE INVENTION

It is, therefore, a primary object of the present invention to provide a data output apparatus and method capable of enabling a high rate data transmission by reducing a swing width upon a data transmission, by an improvement of a structure of the apparatus about a GIO line.

In accordance with an aspect of the present invention, there is provided a data output apparatus includes a read driver driven responsive to an input of read data for inverting and amplifying the data to output inverted and amplified data onto the GIO line, a GIO termination unit driven responsive to a termination signal for rising or falling a voltage level on the GIO line by a preset level, prior to driving the data onto the GIO line by the read driver, and a receiver driven responsive to the read data transmitted through the GIO line for inverting and amplifying the read data to provide inverted and amplified data.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

In accordance with one aspect of the present invention, there is provided a data output apparatus in a global input and output (GIO) line, the apparatus comprising: a read driver driven responsive to an input of read data for inverting and amplifying the data to output inverted and amplified data onto the GIO line; a GIO termination unit driven responsive to a termination signal for rising or falling a voltage level on the GIO line by a preset level, prior to driving the data onto the GIO line by the read driver; and a receiver driven responsive to the read data transmitted through the GIO line for inverting and amplifying the read data to provide inverted and amplified data.

In accordance with another aspect of the present invention, there is provided a method of transmitting data applied to a read driver through a GIO line, comprising the steps of: (a) rising or falling a voltage level on the GIO line in response to a termination signal by a preset level, prior to driving the data onto the GIO line by the read driver; and (b) establishing current sink paths passing through the GIO line and the read driver when the data is being driven onto the GIO line by the read driver.

Hereinafter, preferred embodiments of the present invention will be explained in detail with reference to the accompanying drawings.

Figure 3:
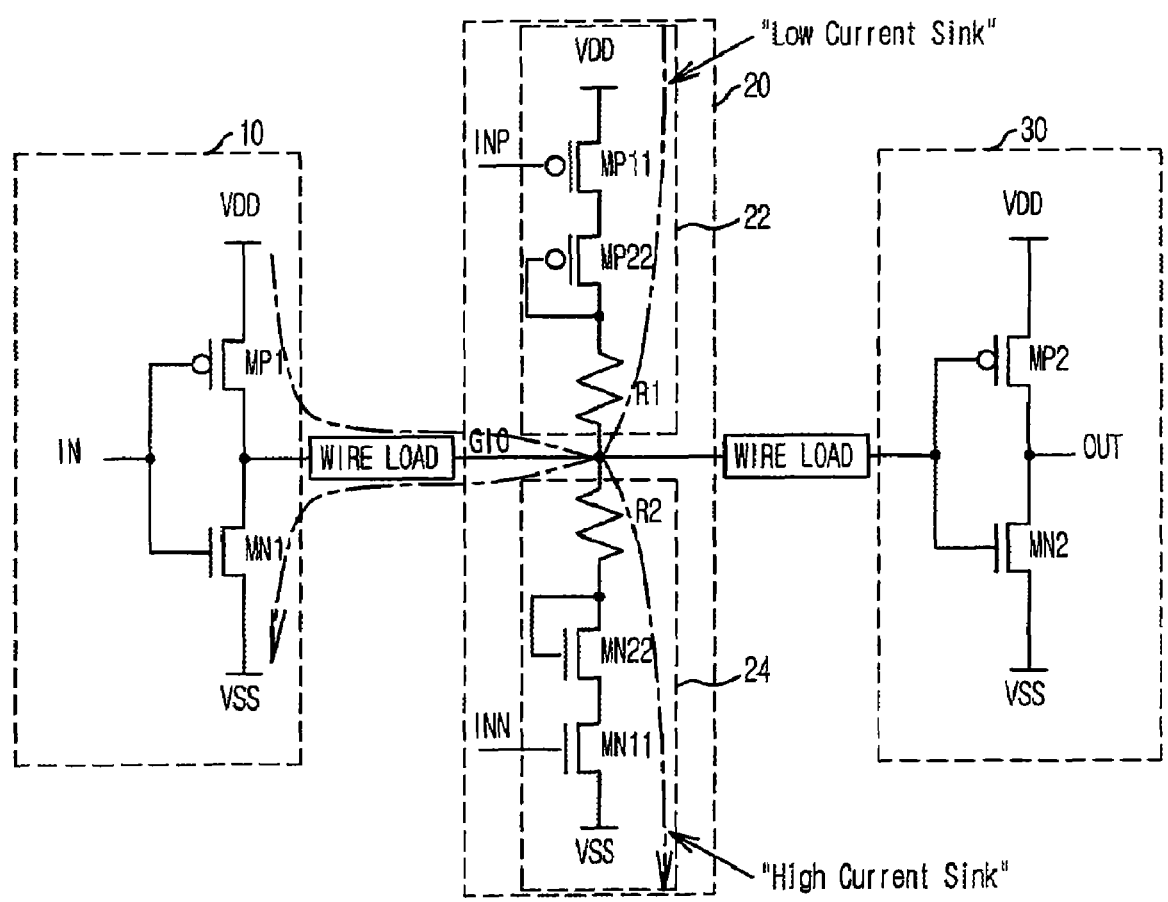
FIG. 3 is a circuit diagram showing a configuration of a data output apparatus in a GIO line in accordance with a first embodiment of the present invention.

FIG. 3 is a circuit diagram showing a configuration of a data output apparatus in a GIO line in accordance with a first embodiment of the present invention.

As shown, the data output apparatus of the invention comprises a read driver 10, a GIO termination unit 20, and a receiver 30.

Specifically, the read driver 10 is driven by read data applied to its input port IN, and inverts and amplifies the read data to provide inverted and amplified data onto a GIO line. This read driver 10 is provided with a PMOS transistor MP1 and an NMOS transistor MN1 as CMOS inverter, which are connected in series between a supply voltage VDD and the ground voltage VSS, and whose gates are coupled in common and input the read data.

The GIO termination unit 20 is provided on the GIO line and driven in response to a termination signal. This unit 20 serves to reduce a swing width of the data transmitted via the GIO line by rising or falling a voltage level of the GIO line by a certain level in advance, prior to driving the read data onto the GIO line by the read driver 10, more particularly before the read data is applied to the input port IN of the read driver 10.

This GIO termination unit 20 includes a low current sink circuit 22 and a high current sink circuit 24.

Specifically, in case that the GIO line is to be driven at logic low, the low current sink circuit 22 creates a current sink path passing through the NMOS transistor MN1 in the read driver 10, to decrease a swing width of the data being driven. This low current sink circuit 22 is composed of a PMOS transistor MP11, a PMOS diode connected transistor MP22, and a resistor R1, which are connected in series between the supply voltage VDD and the GIO line, in which a first termination signal INP is applied to the gate of the PMOS transistor MP11.

Meanwhile, in case that the GIO line is to be driven at logic high, the high current sink circuit 24 establishes a current sink path by way of the PMOS transistor MP1 in the read driver 10, to decrease a swing width of the data being driven. This high current sink circuit 24 is composed of a resistor R2, an NMOS diode connected transistor MN22, and an NMOS transistor MN11, which are coupled in series between the GIO line and the ground voltage VSS, wherein a second termination signal INN is supplied to the gate of the NMOS transistor MN11.

The receiver 30 is driven by the data transmitted through the GIO line, and inverts and amplifies the data to provide inverted and amplified data. This receiver 30 is provided with a PMOS transistor MP2 and an NMOS transistor MN2 as CMOS inverter, which are connected in series between the supply voltage VDD and the ground voltage VSS, and whose gates are coupled in common and also connected to the GIO line.

Figure 4:
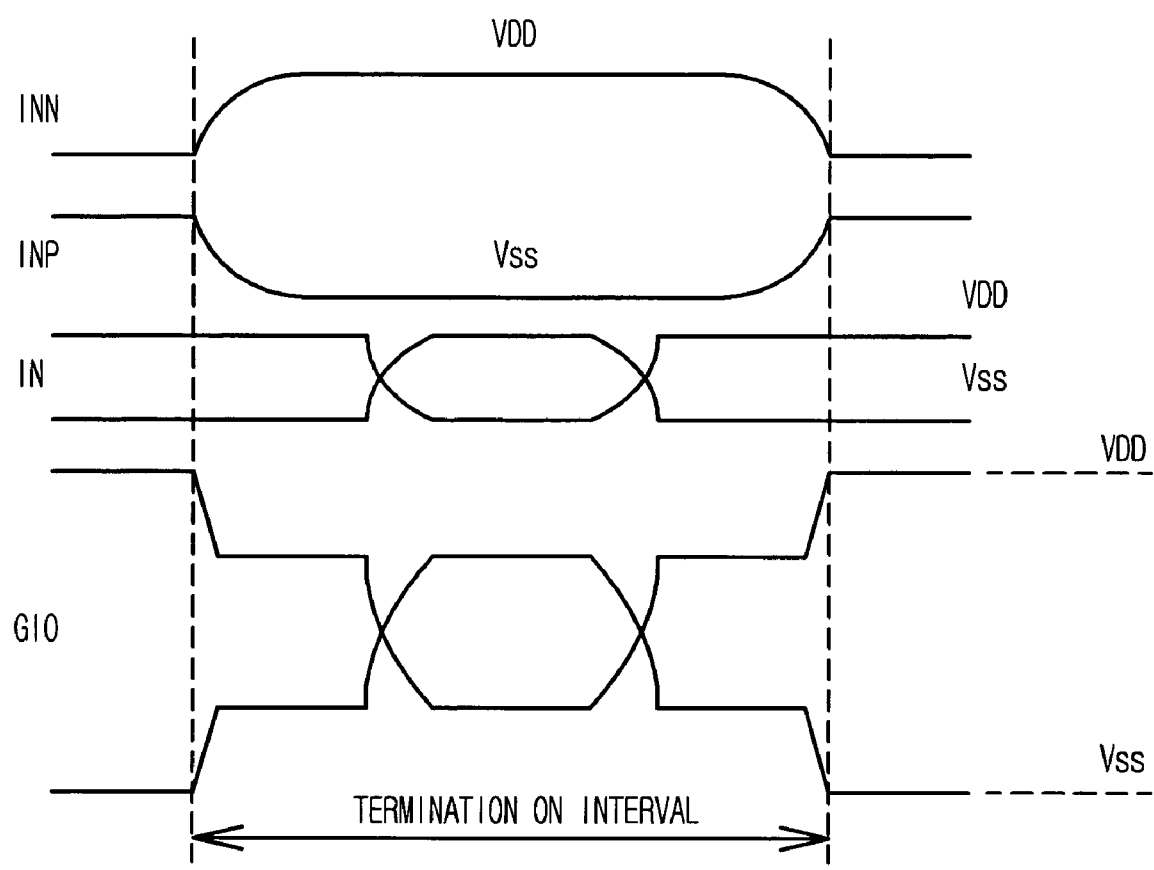
FIG. 4 is a timing diagram for explaining the operation of the data output apparatus depicted in FIG. 3.

FIG. 4 shows a timing diagram for explaining the operation of the data output apparatus depicted in FIG. 3, which will be described simply below.

As in FIG. 4, the first and the second termination signals INP and INN are first activated at logic low and logic high, respectively, before a supply of the read data to the input port of the read driver 10. By the activation of the first and the second termination signals INP and INN, the PMOS transistor MP11 of the low current sink circuit 22 and the NMOS transistor MN11 of the high current circuit 24 are turned on simultaneously ("Termination On"). By doing so, the GIO line is pre-charged with a constant level that is lower than the supply voltage VDD but higher than the ground. voltage VSS.

Next, if the read data is applied to the input port IN of the read driver 10, then any one of the MOS transistors MP1 and MN1 is turned on in response to the data value, making the current sink path between the read driver 10 and the GIO termination unit 20 formed. For instance, if the read data of logic high is provided to the read driver 10 and then data of logic low is being driven onto the GIO line, the NMOS transistor MN1 is turned on, allowing a connection of the GIO line and the ground voltage VSS. Through such a connection, the current sink path (indicated by "Low Current Sink" in FIG. 3) passing through MP11, MP22, R1, and MN1 is established between the low current sink circuit 22 and the read driver 10. In the meantime, if the read data of logic low is applied to the read driver 10 and then data of logic high is being driven onto the GIO line, the PMOS transistor MP1 is turned on, making a connection of the GIO line and the supply voltage VDD. By such a connection, the current sink path (indicated by "High Current Sink" in FIG. 3) by way of MP1, R2, MN22, and MN11 is formed between the read driver 10 and the high current sink circuit 24. At this time, an amount of current being terminated may be controlled depending on resistance values of the resistors R1 and R2.

Figure 1:
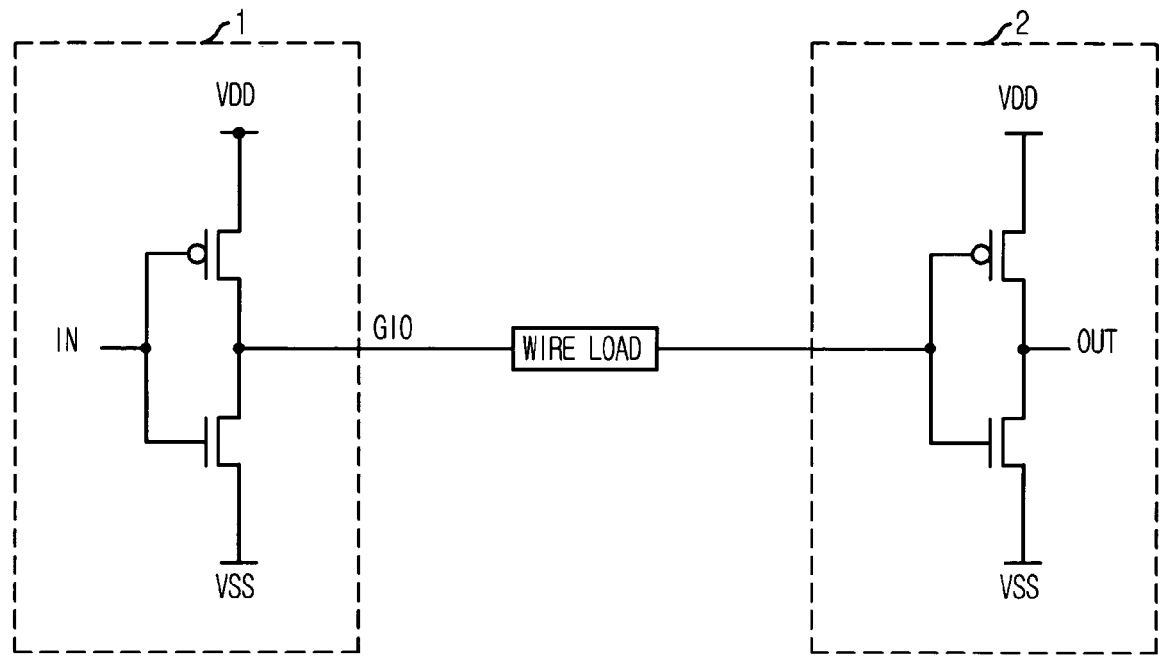
FIG. 1 is a circuit diagram showing a configuration of a conventional data output apparatus in a GIO line.
Figure 2:
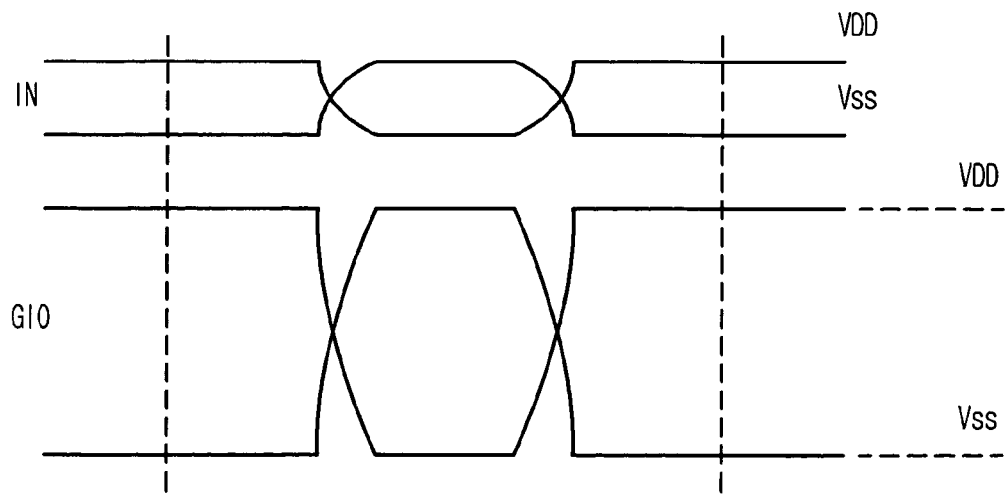
FIG. 2 is a timing diagram representing the operation of the data output apparatus having the structure depicted in FIG. 1.

With these current sink paths, it is allowable to maintain the voltage level on the GIO line at a voltage level formed by the GIO termination unit 20, without a rise to the supply voltage level or fall to the ground voltage level by the data inverted and amplified in the read driver 10. By doing so, the data being driven on the GIO line after the inversion operation in the read driver 10 is not full swung as in FIG. 1, but is swung at the level formed by the GIO termination unit 20. Accordingly, the swing width becomes less than that in FIG. 1, enabling a more rapid signal transmission. This in turn allows a decrease of coupling noise about adjacent lines due to the low voltage level on the GIO line during the transmission of data. At this time, the swing width is determined based on a ratio of a size of the transistor turned on in the read driver 10 to that of the transistor in the corresponding current sink circuit 22 or 24. According to this, it is possible to transmit the data at a more rapid speed while reducing current consumption by means of properly selecting a size of the transistors in the GIO termination unit 20.

Figure 5:
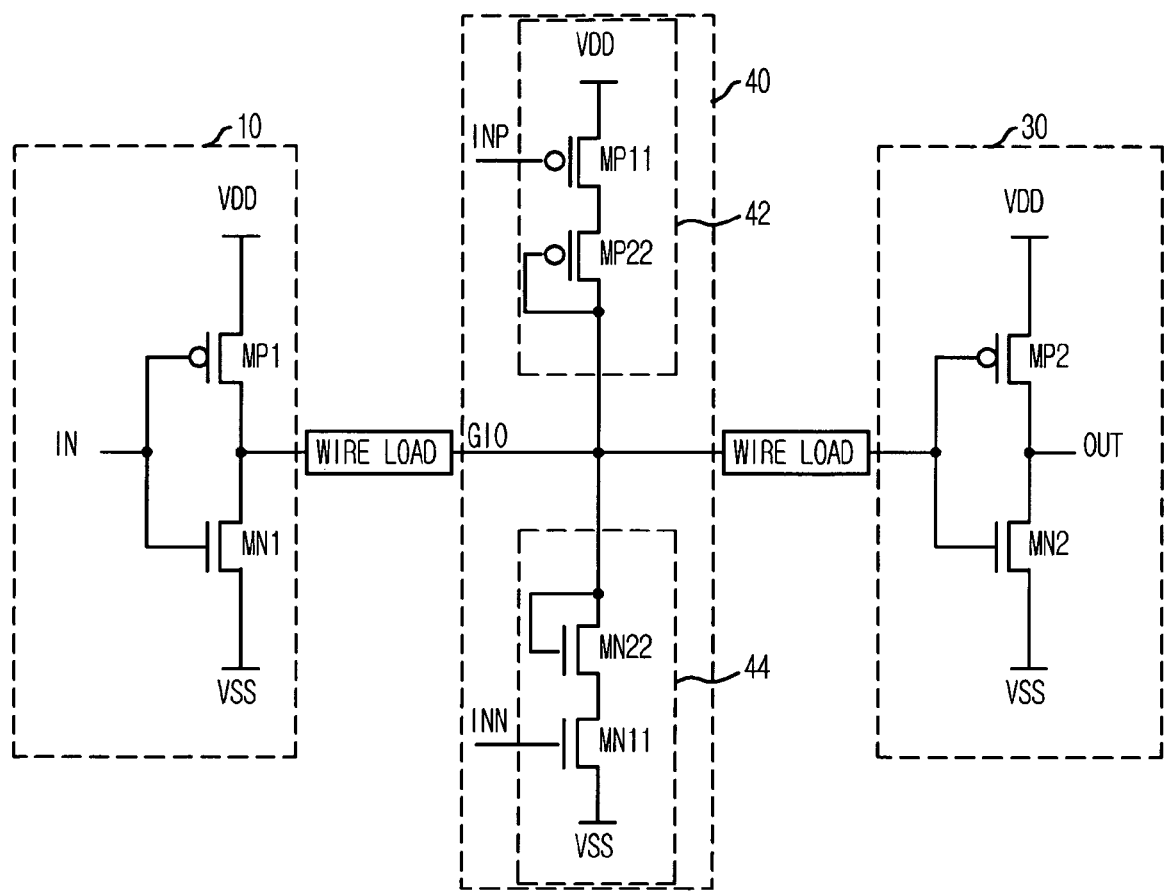
FIG. 5 is a circuit diagram depicting a configuration of a data output apparatus in a GIO line in accordance with a second embodiment of the present invention.
Figure 6:
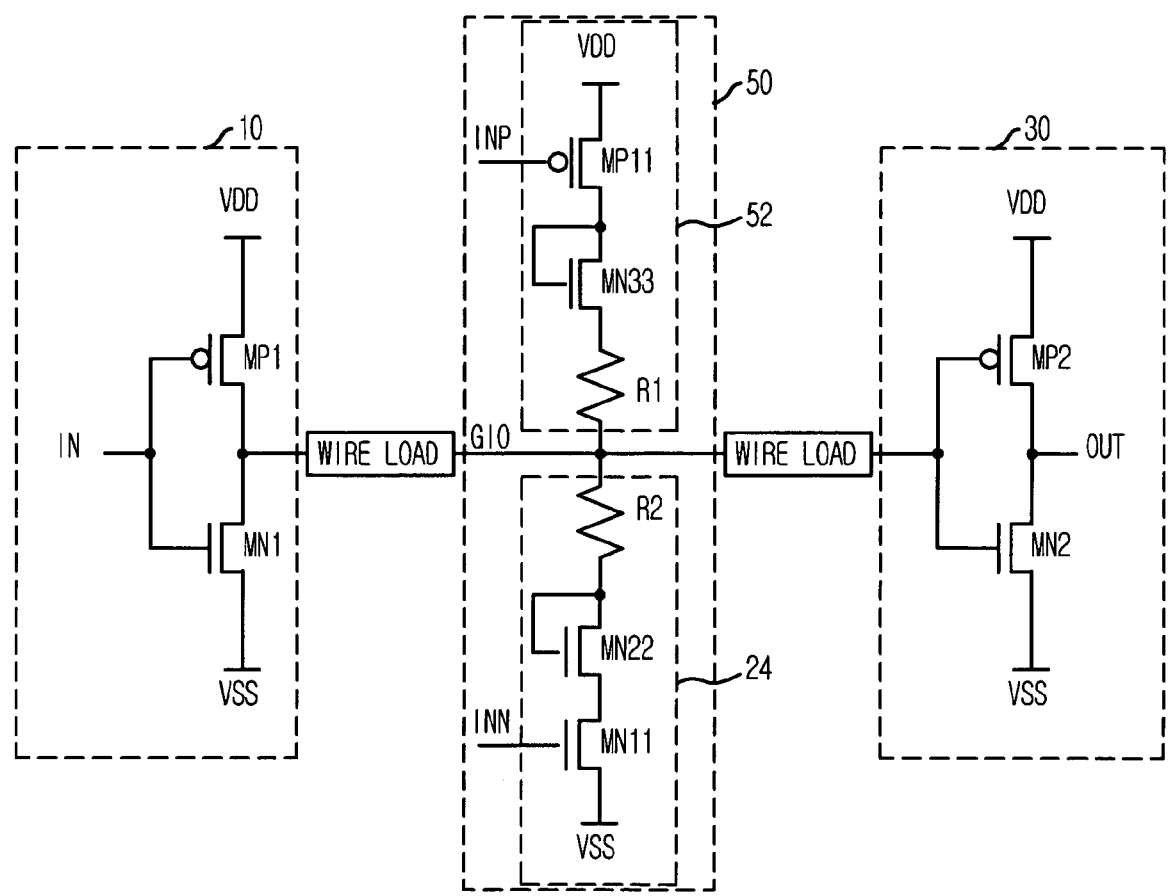
FIG. 6 is a circuit diagram showing a configuration of a data output apparatus in a GIO line in accordance with a third embodiment of the present invention.
Figure 7:
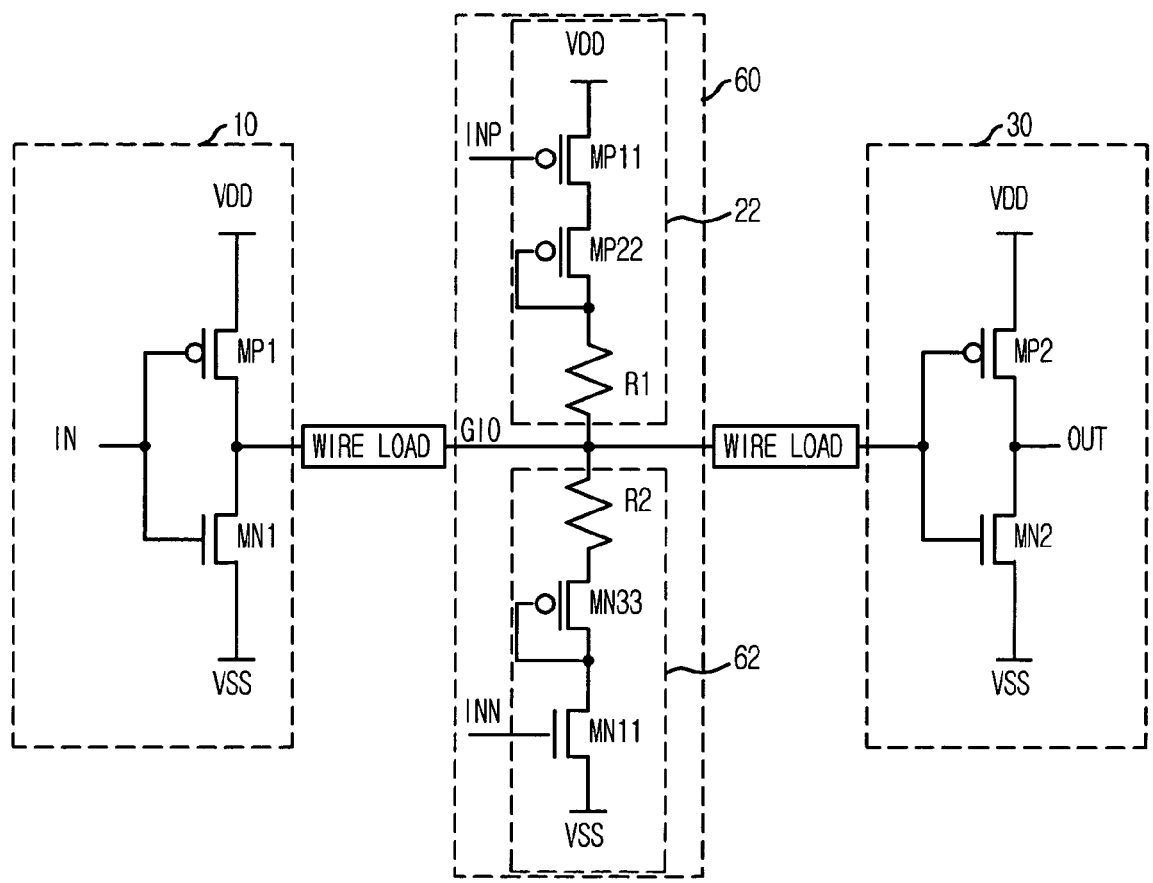
FIG. 7 is a circuit diagram showing a configuration of a data output apparatus in a GIO line in accordance with a fourth embodiment of the present invention.

FIGS. 5 to 7 are circuit diagrams representing configurations of data output apparatuses in a GIO line in accordance with a second to a fourth embodiments of the present invention.

In FIGS. 5 to 7, same reference numbers are given to same elements as those in FIG. 4, in order to distinguish clearly between them.

In comparison with FIG. 4, the data output apparatus of FIG. 5 is comprised of a GIO termination 40 using diodes MP22 and MN22 merely, without a usage of the resistor elements in each of the current sink circuits 22 and 24.

Further, in comparison with FIG. 4, the data output apparatus in FIG. 6 employs an NMOS diode connected transistor MN33, instead of using the PMOS diode connected transistor MP22, in the low current sink circuit 52.

Furthermore, in comparison with FIG. 4, the data output apparatus in FIG. 7 utilizes a PMOS diode connected transistor MP33, instead of using the NMOS diode connected transistor MN22, in the high current sink circuit 62.

The operational principle of the data output apparatuses in FIGS. 5 to 7 above is the same as that of FIG. 4, except for some configurative difference; and thus, their detailed explanation is omitted here for the sake of simplicity.

As described above, the data output apparatus and method of the invention is capable of enabling a high rate data transmission by decreasing a swing width of data transmitted via a GIO line using a GIO termination unit as active load on the GIO line and also reducing a coupling noise on adjacent lines.

The present application contains subject matter related to Korean patent application No. 2005-27404, filed in the Korean Patent Office on Mar. 31, 2005, the entire contents of which being incorporated herein by reference.

While the present invention has been described with respect to the particular embodiments and drawings, it will be apparent to those skilled in the art that various changes and modifications may be made without departing from the spirit and scope of the invention as defined in the following claims.

What is claimed is:

1. A data output apparatus in a global input and output (GIO) line, the apparatus comprising:

a read driver driven responsive to an input of read data for inverting and amplifying the data to output inverted and amplified data onto the GIO line;

a GIO termination unit including a low current sink circuit for rising a voltage level on the GIO line by a first preset level, prior to driving logic low read data onto the GIO line by the read driver, wherein the low current sink circuit has a first switch being on/off in response to a first termination signal and a first MOS diode connected transistor serially connected between a supply voltage and the GIO line; and a receiver driven responsive to the read data transmitted through the GIO line for inverting and amplifying the read data to provide inverted and amplified data, wherein a first current sink path is formed by sequentially passing through the supply voltage, the low current sink circuit, the GIO line, the read driver, and a ground voltage when the logic low read data is being driven onto the GIO line in response to the first termination signal.

2. The apparatus as recited in claim 1, wherein the GIO termination unit further includes:

a high current sink circuit established between the GIO line and the ground voltage to fall the voltage level on the GIO line by a second preset level, prior to driving logic high read data on the GIO line by the read driver, and driven responsive to a second termination signal to thereby produce a second current sink path when the logic high read data is being driven onto the GIO line.

3. The apparatus as recited in claim 1, wherein the low current sink circuit further includes at least one resistor between an output port of the first MOS diode connected transistor and the GIO line.

4. The apparatus as recited in claim 2, wherein the second current sink path is established by sequentially passing through the supply voltage, the read driver, the GIO line, the high current sink circuit, and the ground voltage when logic high read data is being driven onto the GIO line in response to the second termination signal.

5. The apparatus as recited in claim 4, wherein the high current sink circuit includes:

a second switch, whose one port is connected to the ground voltage, and being on/off in response to the second termination signal; and a second MOS diode connected transistor connected between the other port of the second switch and the GIO line.

6. The apparatus as recited in claim 5, wherein the high current sink circuit further includes at least one resistor between the GIO line and an input port of the second MOS diode connected transistor.

7. A method of transmitting data applied to a read driver through a GIO line, comprising the steps of:

(a) rising a voltage level on the GIO line in response to a termination signal by a first preset level, prior to driving the data onto the GIO line by the read driver when logic low data is driven onto the GIO line;

(a1) falling the voltage level on the GIO line in response to a second termination signal by a second preset level, prior to driving the data onto the GIO line by the read driver when logic high data is driven onto the GIO line;

(b) establishing current sink paths passing through in the order of a supply voltage, a current path formed between the supply voltage and the GIO line responsive to the first termination signal in the step (a), the GIO line, the read driver and a ground voltage when the logic low data is being driven onto the GIO line by the read driver in response to the first termination signal; and (b1) establishing a high current sink path passing through in the order of the supply voltage, the read driver, the GIO line, a current path formed between the GIO line and the ground voltage responsive to the second termination signal in the step (a1), and the ground voltage when the logic high data is being driven onto the GIO line in response to the second termination signal.

8. The method as recited in claim 7, wherein the step (a) or (a1) forms the voltage level on the GIO line into a given level between the supply voltage and the ground voltage.

* * * * *